(12) United States Patent
Sakamoto et al.

(10) Patent No.: US 6,696,310 B2
(45) Date of Patent: *Feb. 24, 2004

(54) MANUFACTURING METHOD OF LIGHTING DEVICE

(75) Inventors: Noriaki Sakamoto, Omama-machi (JP); Yoshiyuki Kobayashi, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/201,610

(22) Filed: Jul. 24, 2002

(65) Prior Publication Data

US 2003/0022407 A1 Jan. 30, 2003

(30) Foreign Application Priority Data

Jul. 25, 2001 (JP) .......................................... 2001-224266
Jul. 25, 2001 (JP) .......................................... 2001-224268

(51) Int. Cl.[7] .............................................. H01L 21/00
(52) U.S. Cl. .............................. 438/30; 438/28; 438/29
(58) Field of Search ............................. 438/30, 28, 29, 438/25, 26, 112, 118, 538

(56) References Cited

U.S. PATENT DOCUMENTS

| 534,330 | A1 | * | 3/2003 | Sakamoto et al. | ............ | 438/29 |
| 6,534,330 | B2 | * | 3/2003 | Sakamoto et al. | ............ | 438/29 |
| 6,558,970 | B2 | * | 5/2003 | Sakamoto et al. | ............ | 438/22 |

FOREIGN PATENT DOCUMENTS

| FR | 002794927 A1 * | 12/2000 |
| TW | 463394 | 12/2000 |
| TW | 507482 | 10/2002 |

* cited by examiner

*Primary Examiner*—Caridad Everhart
(74) *Attorney, Agent, or Firm*—Morrison & Foerster LLP

(57) ABSTRACT

A lighting device using a light-emitting device with improved heat dissipation is offered. A lighting device with a light-emitting device mounted on a metal substrate is offered. The light-emitting device consists of a plurality of conductive passages electrically separated from each other, an optical semiconductor element attached to a desired conductive passage and a transparent resin covering the optical semiconductor element and supporting the conductive passages in one piece.

12 Claims, 7 Drawing Sheets

MANUFACTURING METHOD OF LIGHTING DEVICE

BACKGROUND OF THE INVENTION

1. Field of the Invention

This invention relates to a manufacturing method of lighting device, specifically to a manufacturing method of lighting device using a light-emitting device with improved thermal dissipation.

2. Description of the Related Art

Electric lamps are commonly used when large amount of lighting is required. In some cases where a lighter, thinner and smaller lighting device is required, printed circuit boards with light-emitting elements, such as the one shown in FIG. 10, are used.

Although the light-emitting elements are light-emitting diodes (hereinafter referred to as LED) in most cases, semiconductor lasers or the likes are also conceivable.

The light-emitting element 2 is provided with two leads 3 and 4. The backside (anode or cathode) of the LED 5 is soldered to one of the leads 3, and the other lead 4 is electrically connected to a topside electrode (cathode or anode) of the LED 5 through a metal wire 6. The leads 3 and 4, the LED 5 and the metal wire 6 are encapsulated in transparent sealing resin 7, which also works as a lens.

The leads 3 and 4 are inserted into through holes in the printed circuit board 1 and soldered to electrodes 8 and 9 provided on the printed circuit board 1 for supplying power to the light-emitting element 2.

An example of the light-emitting device using the light-emitting element is described in Japanese Laid Open Patent Publication No. Hei 9-252651.

A drawback is that the size of the printed circuit board 1 is large because the light-emitting element 2 consists of a package which includes sealing resin 7, leads 3 and 4 and so on.

Manufacturers have been competing in development of various structures to realize a smaller, thinner and lighter device. Recently, a wafer scale CSP (chip size package), which has the size comparable to or slightly larger than a die has been developed.

FIG. 11 shows a CSP 12, which adopts a glass epoxy substrate 11 as a supporting substrate, and is slightly larger than a die. Following explanation assumes that an LED 13 is mounted on the glass epoxy substrate 11.

A first electrode (die pad) 14 and a second electrode 15 are formed on a topside of the glass epoxy substrate 11, and a first backside electrode 16 and a second backside electrode 17 are formed on a backside of the substrate. The first electrode 14 is electrically connected to the first backside electrode 16 through a through hole TH, and the second electrode 15 is electrically connected to the second backside electrode 17 similarly.

A bare die of the LED 13 is attached to topside of the die pad 14. A topside electrode of the LED 13 is connected to the second electrode 15 through a metal wire 18. A layer of resin 19 covers an entire surface of the glass epoxy substrate 11 including the LED 13.

The CSP 12 adopts the glass epoxy substrate 11. Unlike the wafer scale CSP, it easily realizes a structure extended from the LED 13 to the backside electrode 16, which is for external connection, and has an advantage of less manufacturing cost.

In a manufacturing method of the CSP 12, firstly copper foils (hereafter referred to as Cu foils) 20 and 21 are attached on both sides of a base material (supporting substrate) of the glass epoxy substrate 11 with an insulative adhesive, as shown in FIG. 11A.

Next, as shown in FIG. 11B, patterning is made to the Cu foils 20 and 21, after areas to form the first electrode (die pad) 14, the second electrode 15 and the first and second backside electrodes 16, 17 are covered with etching-resistant films 22. The patterning could be done on the topside and the backside separately.

Then, as shown in FIG. 11C, holes for the through holes TH are formed in the glass epoxy substrate using a drill or a laser, and the holes are plated to form the through holes TH. The die pad 14 and the first backside electrode 16 as well as the second electrode 15 and the second backside electrode 17 are electrically connected respectively by the through holes TH.

Furthermore, as shown in FIG. 11D, a backside (anode or cathode) of the LED 13 is die-bonded to the die pad 14, which forms a bonding post, after the die pad 14 is coated with nickel and gold plating.

Finally, the topside electrode (cathode or anode) of the LED 13 and the second electrode 15 are electrically connected through the metal wire 18, and covered with the resin layer 19.

Although only one LED 13 is shown on the glass epoxy substrate 11 in FIG. 11, many LEDs are provided in matrix form in practical applications. When necessary, each electric circuit element is separated into individual electric circuit element in final dicing step.

The CSP type electric circuit element, which adopts the glass epoxy substrate as the supporting substrate 11, is completed by the manufacturing method described above. The manufacturing method can be applied also when a flexible sheet is adopted as the supporting substrate.

The LED 13, the first electrode 14, the second electrode 15, the first backside electrode 16, the second backside electrode 17 and the metal wire 18 are components necessary for external connection and protection of the die. It has been difficult to realize a small, thin and light electric circuit element with all of these components.

The glass epoxy substrate, which makes the supporting substrate, is functionally not necessary. However, omitting the glass epoxy substrate 11 is not possible, since it is used in the manufacturing process as the supporting substrate to attach the electrodes.

Therefore the glass epoxy substrate has been adopted and resulted in increased cost. Furthermore, thick glass epoxy substrate has made the circuit element thick, and set a limit for reducing size, thickness and weight.

Another problem is long through hole forming process, which is essential with the glass epoxy substrate 11 or a ceramic substrate in order to connect the electrodes on both sides of the substrate.

Also, there is a problem of increased temperature due to poor heat dissipation of the substrate, which results in increased die temperature and reduced driving capability.

Also, efficiency in use of the light from the LED is not good, because the printed circuit board and the glass epoxy substrate can not direct the light upward, which is emitted from the side of the LED toward the substrate.

SUMMARY OF THE INVENTION

The invention provides a manufacturing method of lighting device including providing a conductive foil and forming a plurality of separation grooves in the conductive foil to define portions of the conductive foil to be used as conductive passages. The depth of the separation groove is shorter than a thickness of the conductive foil. An optical semiconductor element is fixed on one of the defined portions of the conductive foil. The optical semiconductor element and the conductive foil are covered with a transparent resin so that the separation grooves are filled with the transparent resin. A backside portion of the conductive foil, which is not covered by the transparent resin, is removed to expose the transparent resin. A portion of the conductive foil having the optical semiconductor element and covered by the transparent resin is separated to provide a light-emitting device. The light-emitting device is mounted on a metal substrate.

A starting material is the conductive foil that is to form the conductive passages. Before being covered by the transparent resin, the conductive foil functions as supporting structure. Once the transparent resin covers the device elements, the resin also functions as supporting structure. Thus, the manufacturing method dispenses with the supporting substrate.

As described above, each light-emitting device covered with the transparent resin is separated by removing the conductive foil of the side on which the separation grooves are not formed and exposing the resin, after the light-emitting devices are covered by the transparent resin to fill the separation grooves. The conductive foil is processed as single sheet until the last processing step, in which each light-emitting device is separated. Thus the workability is improved.

DETAILED DESCRIPTION OF THE INVENTION

An embodiment of the invention will be described below with reference to the drawings.

Figure 1:
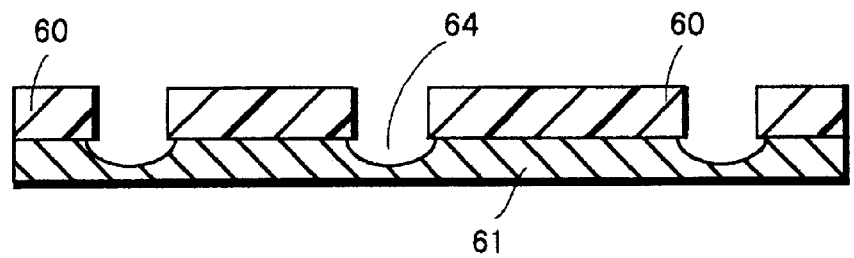
FIG. 1 is a cross-sectional diagram showing a manufacturing method of a lighting device according to a first embodiment of the invention.

A material for a conductive foil 61 in FIG. 1 is chosen, based on considerations on adhering characteristics to brazing materials, bonding strength and suitability for plating, from a group including copper-based materials, aluminum-based material, Fe (iron)—Ni (nickel), Cu—Al and Al—Cu—Al multi-layer film.

Thickness of the conductive foil is preferably from 10 μm to 300 μm in consideration of later process step of etching, and is chosen to be 150 μm in this embodiment. However, it could be thicker than 300 μm or thinner than 10 μm, as long as the separation grooves 64 shallower than the conductive foil 61 could be formed in it as described later.

The conductive foil 61 could be prepared and supplied in a form of a roll of pre-determined width, or in a form of cut-sheet of a pre-determined size.

Then the conductive foil 61 is subject to half-etching with a mask of a photo-resist film 60 having openings on the topside of the conductive foil 61 (backside of the conductive foil is omitted in FIG. 1), and pre-determined regions on the conductive foil 61 are half-etched to form the separation grooves 64. The depth of a separation groove 64 formed by the etching is 80 μm, for example. Since the side of the separation grooves 64 becomes rough surface, adhering strength to a transparent isolation resin 67 is improved.

The half-etching could be done after a silver film 62, which will be described later, is formed using a mask of a photo-resist film covering the silver film 62.

A shape of the sidewall of the separation groove varies depending on a removing method. The removing method could be either wet etch, dry etch, evaporation by laser, dicing or the like.

In the case of wet etching for example, ferric chloride or cupric chloride is mostly adopted as an etchant. The conductive foil 61 is dipped into the etchant or showered with the etchant. Since wet etching is isotropic in general, the side of the groove becomes curved.

In the case of dry etching, both isotropic and anisotropic etching is possible. Because it is difficult to apply reactive ion etching to remove copper, sputtering is used in this embodiment to remove copper. Depending on sputtering conditions, either isotropic or anisotropic etching is possible.

Also, the separation grooves can be formed by direct exposure to a laser beam. In this case, the side of the separation groove 64 is formed rather straight.

Dicing can form matrix shaped separation grooves, although curved complex pattern is not possible with dicing process.

Figure 2:
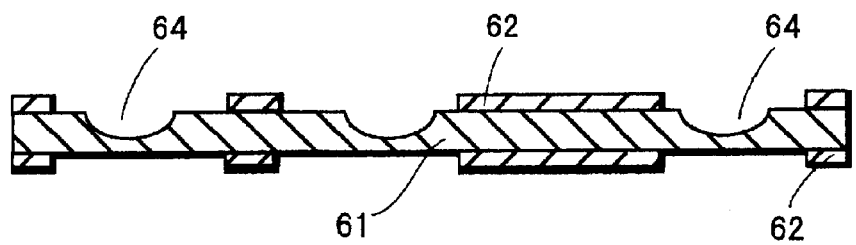
FIG. 2 is a cross-sectional diagram showing the manufacturing method of the lighting device according to the first embodiment of the invention.

Next as shown in FIG. 2, a pre-determined area on both sides of the conductive foil 61 is plated. Although a film consist of silver plating (hereafter referred to as Ag film 62) is formed in the embodiment, the conductive film is not limited to silver. There are alternative materials such as gold, nickel, aluminum and palladium. These corrosion-resistant conductive films have characteristics to be utilized as a die pad or a bonding pad. The Ag film 62 can be formed only on the topside of the conductive foil 61.

For instance, the Ag film 62 adheres to both gold and the brazing material. Therefore, with the gold film covering the backside of the die, the die can be bonded to the Ag film 62 on the conductive passage 51 by thermo-compression bonding or through the intermediary of brazing material such as solder. Furthermore, a wire bonding is possible because a gold wire can adhere to the Ag film.

The Ag film 62 formed on the conductive foil 61 reflects the light emitted from an optical semiconductor element 65, which will be described later. This improves an efficiency of upward light emission.

However, if the area of Ag film 62 is too wide and reduces contact area between the conductive foil 61 and the isolation resin 67, such a configuration results in falling off, when the conductive foil 61, on which the optical semiconductor element is mounted as described later, is sealed with the isolation resin 67. This is because adhering strength of the Ag film 62 to the isolation resin 67 is lower than that of the conductive foil 61 made of copper to the isolation resin 67. Therefore the area to form the Ag film 62 is determined considering both the adhering strength of the conductive foil 61 to the isolation resin 67 and the reflection efficiency of the light from the light-emitting device 68 by the Ag film 62.

Pressurizing the conductive foil 61 and the Ag foil 62 formed on it by means of a press or the like, gives a luster to the Ag film 62, and improves the reflection efficiency.

Figure 3:
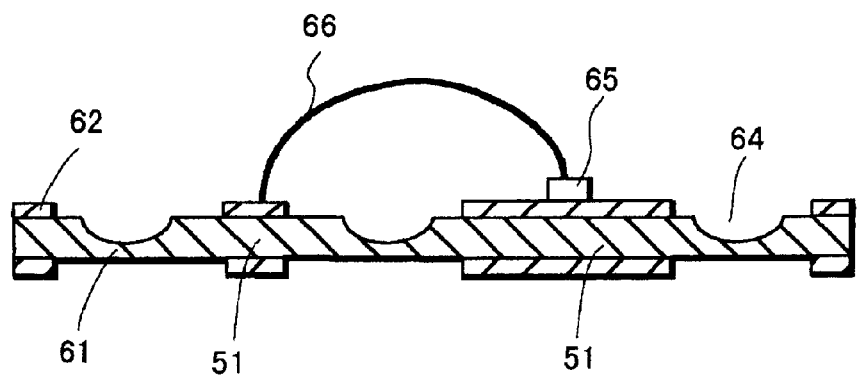
FIG. 3 is a cross-sectional diagram showing the manufacturing method of the lighting device according to the first embodiment of the invention.

The optical semiconductor element 65 is mounted on and connected to the conductive foil 61 with the separation grooves formed on it as shown in FIG. 3. Here, an LED is used as the optical semiconductor element 65. The backside of the optical semiconductor element 65 is die-bonded on a first conductive electrode (die pad) 51A, and a metal wire 66 is wire-bonded to connect a topside of the optical semiconductor element 65 and a second conductive electrode 51B. (Refer to FIG. 5). In this embodiment, a cathode that is the backside of the optical semiconductor element 65 is bonded on the first conductive electrode 51A, and an anode that is the topside of the optical semiconductor element 65 is wire-bonded to the second conductive electrode 51B with the metal wire 66. It is also possible that the anode of the optical semiconductor element 65 is bonded on the first conductive electrode 51A, and the cathode of the optical semiconductor element 65 is wire bonded to the second conductive electrode 51B with the metal wire 66.

Figure 4:
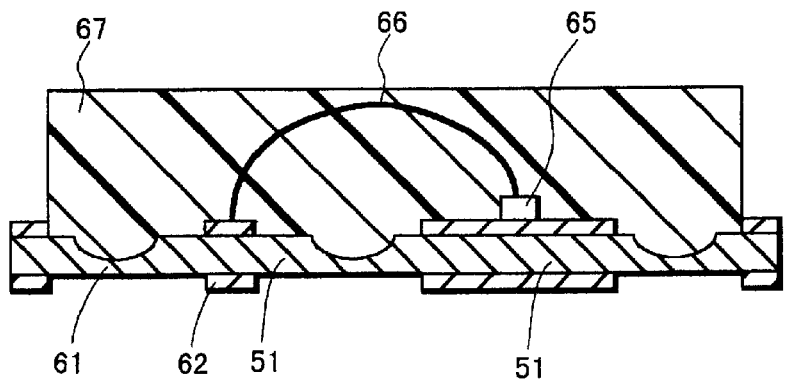
FIG. 4 is a cross-sectional diagram showing the manufacturing method of the lighting device according to the first embodiment of the invention.

Next, as shown in FIG. 4, the optical semiconductor element 65 is sealed and covered by the isolation resin 67, which is transparent to the light emitted from the optical semiconductor element 65. In the manufacturing process of this embodiment, the optical semiconductor element 65 and the conductive foil 61 with the separation groove 64 are sealed with thermosetting silicone resin or epoxy resin, by transfer molding using a mold (not shown in FIG. 4). As described above, the resin has to be pervious to the light. Therefore a transparent resin or a resin transparent at least to a light of pre-determined wavelength is used.

Although only one optical semiconductor element 65 is shown in FIG. 4, a plurality of the optical semiconductor elements 65 is formed in matrix form in practical applications, and each optical semiconductor element 65 is molded individually when it is covered with the transparent resin 67. In general, when filler, which is used to prevent a warp, is mixed into the resin, light is diffused. Since the filler cannot be used, each optical semiconductor element 65 (each light-emitting device described later) needs to be molded individually.

Figure 10:
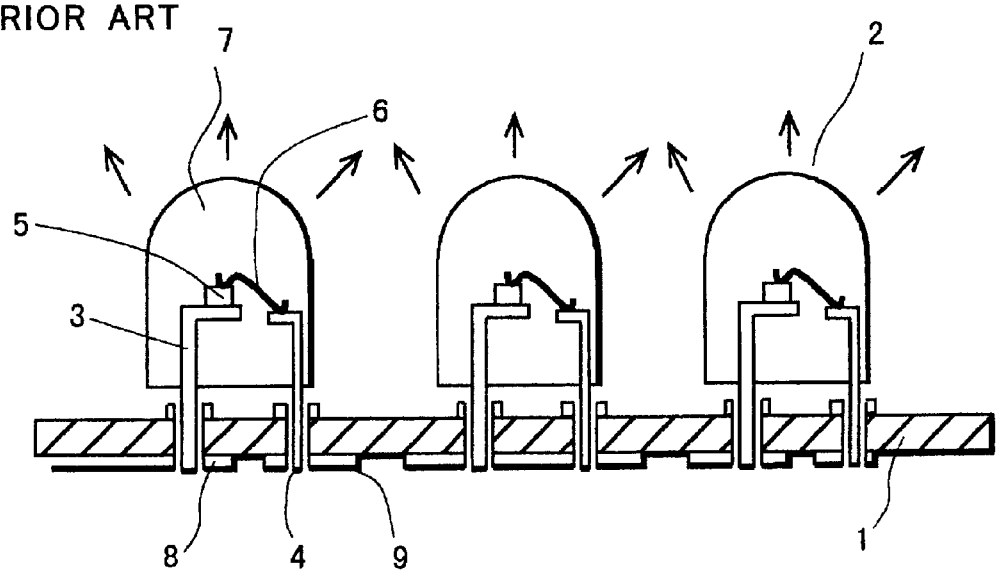
FIG. 10 shows a cross-sectional view of a conventional lighting device.
Figure 11A:
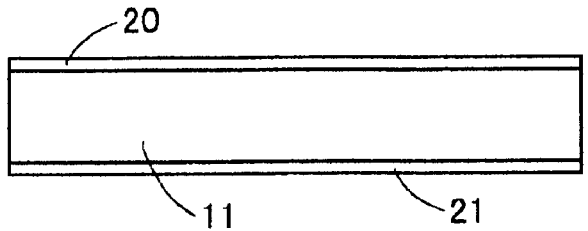
FIG. 11A–11D show cross-sectional views to explain manufacturing steps of the conventional lighting device.
Figure 11B:
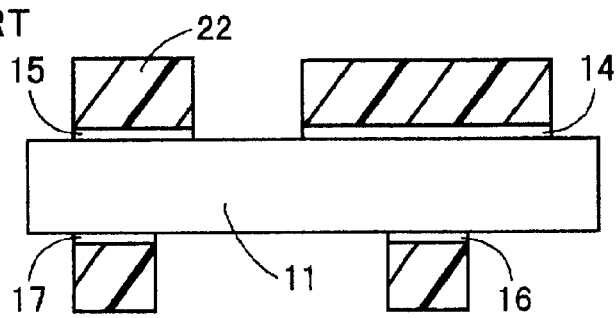
Figure 11C:
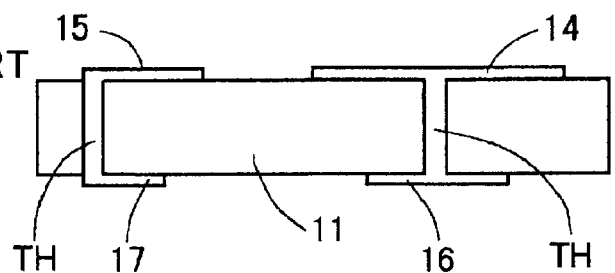
Figure 11D:
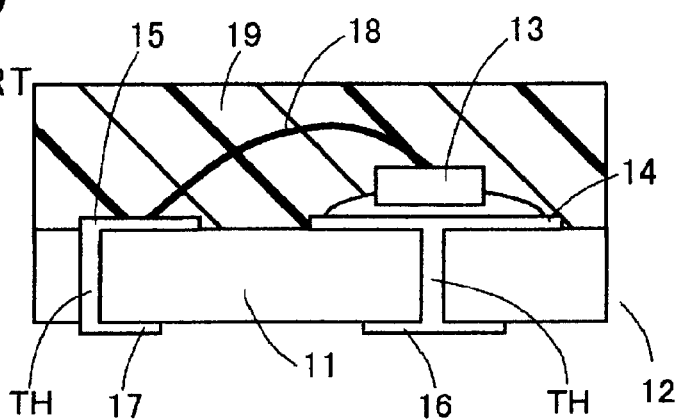

In this manufacturing process of the first embodiment, the conductive foil works as a supporting substrate until the transparent resin 67 covers the optical semiconductor element. Driving capability of the lighting device is improved, since the lighting device of this embodiment has better heat dissipation than conventional one that is constructed as the light-emitting element 2 on the printed circuit board 1 (Refer to FIG. 10).

In this invention, the conductive foil 61 that is essential as the electrode material is used also as the supporting substrate, minimizing constituent elements and reducing cost.

Also, the conductive foil 61 is not separated into conductive passage 51, since the separation grooves 64 are formed to be shallower than the thickness of the conductive foil 61. Therefore it can be processed as a sheet of conductive foil 61, making operation very easy in molding with the transparent resin and carrying and setting it to the mold.

Figure 5:
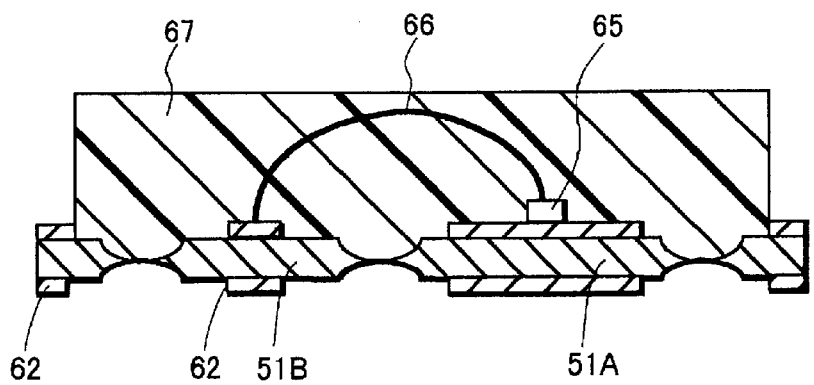
FIG. 5 is a cross-sectional diagram showing the manufacturing method of the lighting device according to the first embodiment of the invention.

Furthermore in FIG. 5, there is a process step to remove the backside of the conductive foil 61 chemically and/or physically to separate it into conductive passages 51.

The removing process is done by polishing, grinding, etching or metal evaporation by a laser.

In this embodiment, the conductive foil 61 is wet etched with a mask of photo-resist film (not shown in FIG. 5) covering entire top surface and portions of the conductive foil 61 to become the conductive passages and the silver film 62 on the backside. The conductive foil 61 under the separation grooves 64 is thinned to expose the transparent resin 67 and to separate each conductive passage 51. This forms a structure in which the surface of the conductive passages 51A and 51B (the first and the second electrodes) exposed from the transparent resin 67.

Another method is to scrape off the backside of the conductive foil 61 by about 50–60 $\mu$m with a polishing apparatus or a grinding apparatus to expose the transparent resin 67 at the separation grooves 64. In this case, the conductive passage 51 with a thickness of about 40 $\mu$m is separated. And it is also possible to wet etch entire backside of the conductive foil 61 just before the transparent resin is exposed, and then to scrape off the entire backside with a polishing apparatus or a grinding apparatus to expose the transparent resin 67. In this case, a flat light-emitting device is realized with the conductive passage 51 embedded in the transparent resin 67 and with the backside of the transparent resin 67 and the backside of the conductive passage 51 coincided with each other.

When the conductive passage 51 is separated by scraping the backside of the conductive foil 61 with the polishing apparatus or the grinding apparatus, it is possible to apply an anti-oxidation process of the conductive passage 51 by coating the exposed conductive passage 51 with a conductive material such as solder. Coating with an anti-oxidant is also possible.

Figure 6:
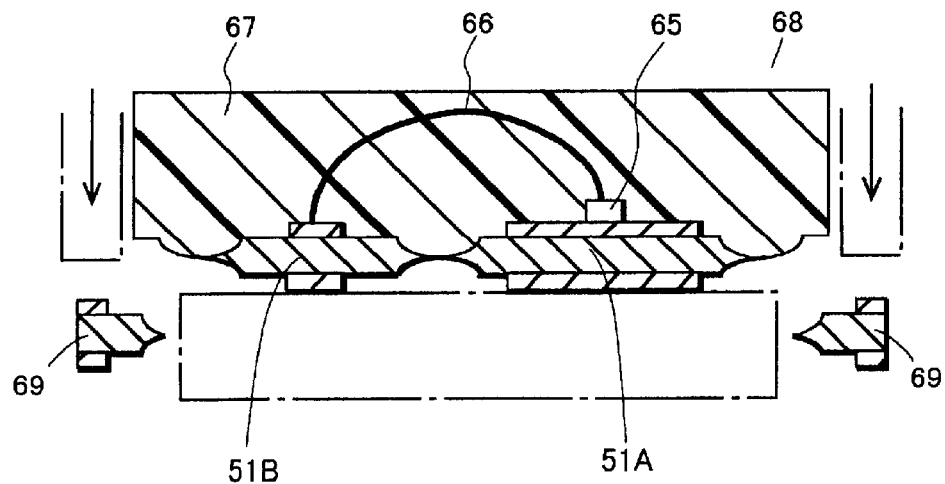
FIG. 6 is a cross-sectional diagram showing the manufacturing method of the lighting device according to the first embodiment of the invention.

Then the light-emitting device 68 is completed by separating a light-emitting device from adjacent ones with a dicing apparatus as shown in FIG. 6.

In place of dicing, cutting, chocolate-breaking or the like may be used in the separation process. When the chocolate-breaking is adopted, each light-emitting device 68 is separated as copper chips 69 are torn off at both ends of the transparent resin 67 covering the light-emitting device with a plunger indicated by broken lines in FIG. 6. This chocolate-breaking process does not generate burrs and, thus, requires no additional processing step to remove the burrs.

The manufacturing method of this embodiment is characterized by utilizing the transparent resin 67 as the supporting substrate in the separation process of the conductive passage 51. The transparent isolation resin 67 is essential to embed the conductive passage 51. There is no need of a dedicated supporting structure. Therefore, the number of the elements is minimized and the cost is reduced.

Figure 7:
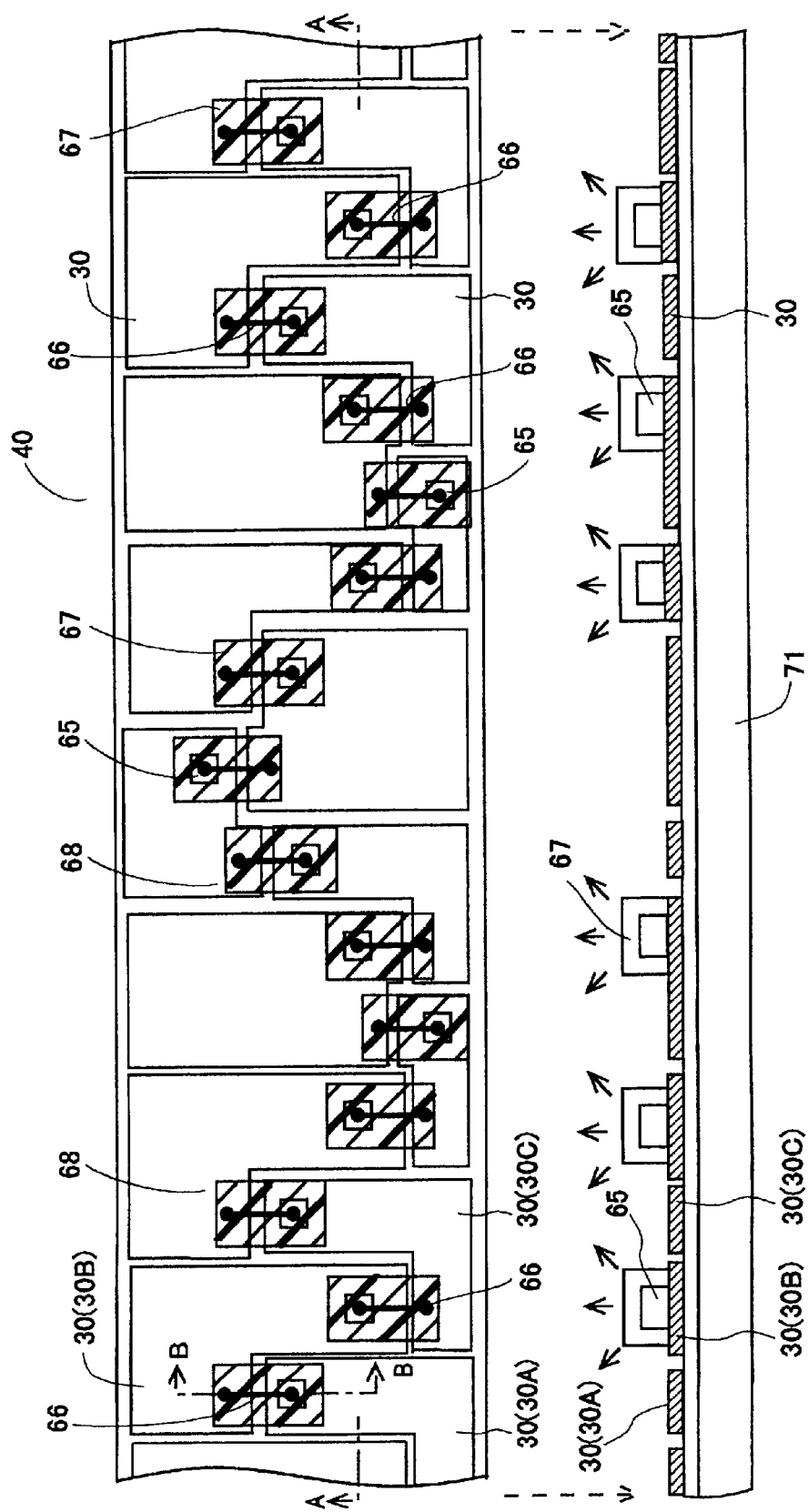
FIG. 7 shows a top view and a cross-sectional view of the lighting device of the first embodiment with a plurality of the light-emitting devices connected in series.

FIG. 7 shows a lighting device 40, in which each of the electrodes 30 is formed on a metal substrate (circuit substrate). The light-emitting devices (LEDs) on the electrodes 30 are connected in series to provide a current flowing through the light-emitting devices constant.

Figure 8A:
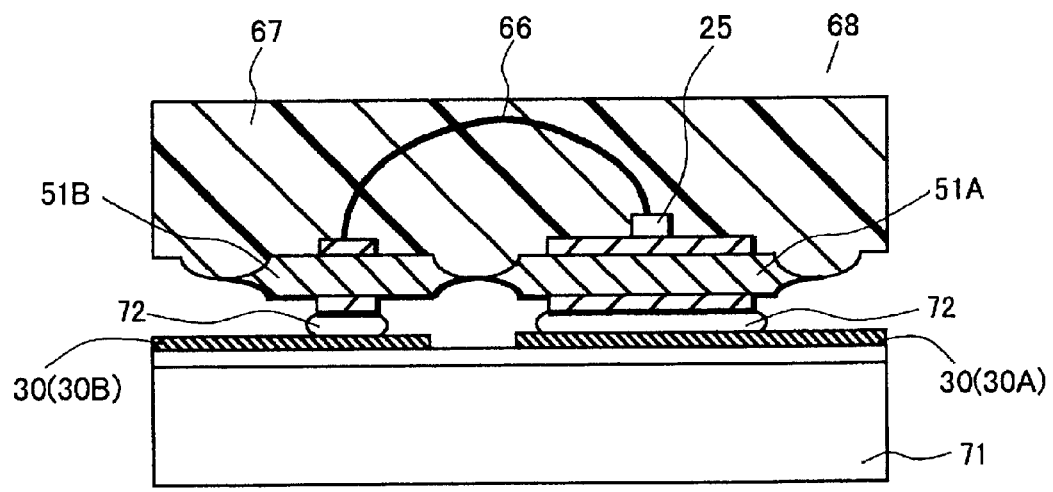
FIG. 8A shows a cross-sectional view of a light-emitting device of the first embodiment fixed to a metal substrate.

A backside (a first electrode 51A) of a die that makes a cathode (or an anode) of a light-emitting device 68 is attached to a first electrode 30A with a solder 72 (See FIG. 8A). A second electrode 51B wire-bonded with an anode (or a cathode) through a metal wire 66 and a second electrode 30B are connected with a solder. A backside (a first electrode 51A) of a die that makes a cathode (or an anode) of a next light-emitting device 68 is attached to a second electrode 30B with a solder 72. A second electrode 51B wire-bonded with an anode (or a cathode) through a metal wire 66 and a third electrode 30C are connected with a solder 72. The series connection is realized by repeating this connection form.

A melting point (about 140 □) of the solder 72 used in this embodiment is lower than a molding temperature (about 160 □) of the transparent resin. Therefore, the conductive electrodes 51A and 51B, which are metal electrodes of light-emitting device, can be prevented from falling off the mold resin 67 due to a gap or a clack caused by a thermal expansion of the resin 67 when the light-emitting device 68 is soldered to the metal substrate 71. An example of low melting point solder is lead (Pb) free tin (Sn) based solder (bismuth (Bi) and antimony (Sb) contained). Solder with a melting point approximately the same as or higher than the molding temperature of the mold resin can be used as well.

A surface of the copper foil is covered with nickel in order to make it a reflector. The light-emitting device 68 is placed at a predetermined location by a robot with an arm movable in the X, Y and Z directions.

With this structure, heat generated by the light-emitting device 68 is dissipated through the metal substrate 71, giving the light-emitting device 68 an advantage of increased drive current.

A lighting device with light-emitting devices connected in parallel or a lighting device formed with a combination of parallel connection and serial connection of the light-emitting devices can also realize a lighting device with improved heat dissipation.

The above-mentioned lighting device 40 is good in workability when it is used as a light source for plant growing, since the light-emitting device 68 can be directly mounted on the metal substrate 71.

The effectiveness of this invention will be explained in comparison with a reference lighting device shown in FIG. 12, which is not a prior art within the meaning of 35 USC 102. The reference lighting device of a desired size is formed by a complicated process, in which optical semiconductor elements 25 are, first, mounted on a small first metal substrate 23, and then a plurality of the first metal substrates 23 is mounted on a large second metal substrate 24.

Figure 12:
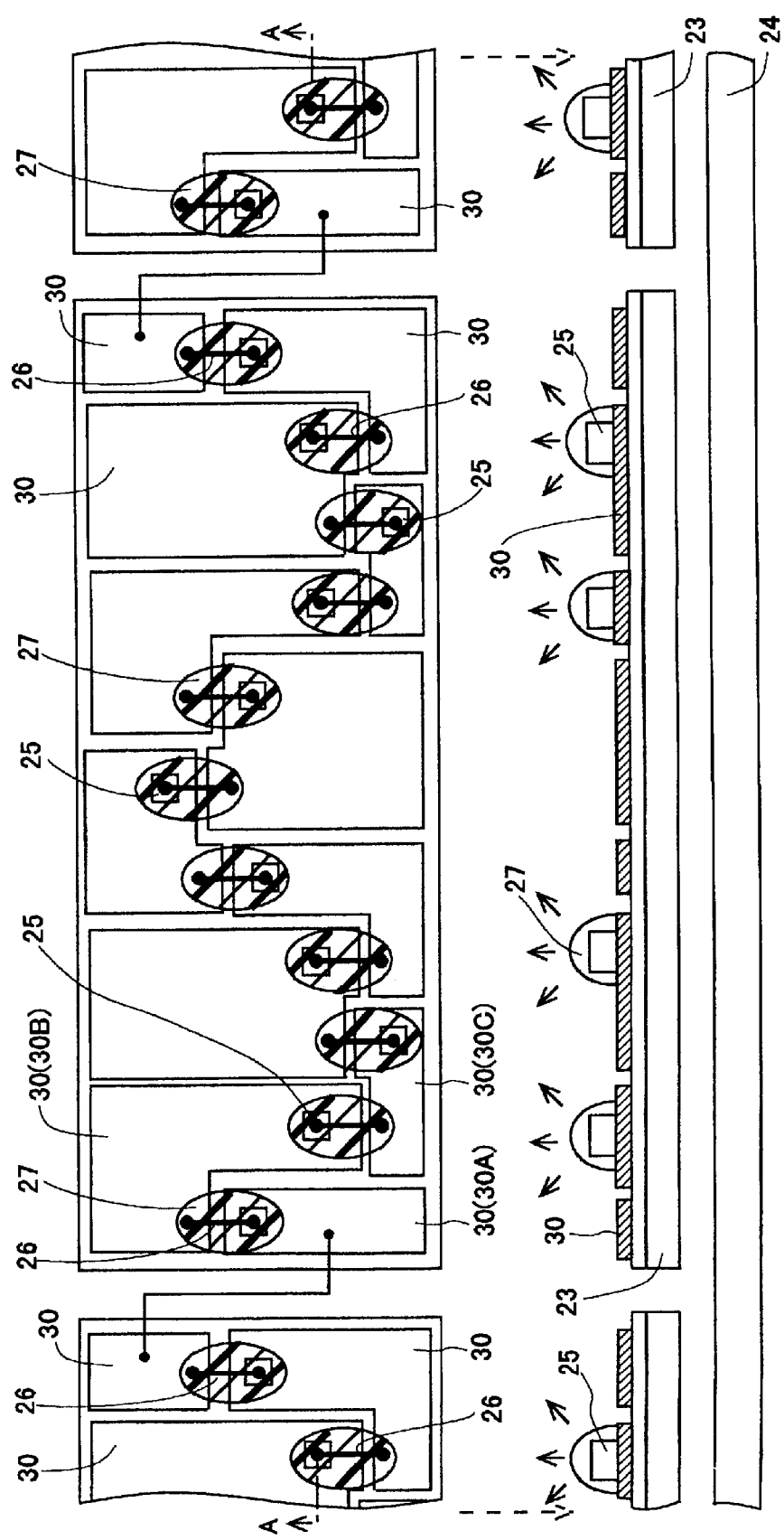
FIG. 12 shows a top view and a cross-sectional view of a reference lighting device.

As shown in FIG. 12, twelve electrodes 30 are formed on the first substrate 23, a backside of a die that makes a cathode (or anode) of an optical semiconductor device 25 (LED) is attached to a first electrode 30A, and an anode (or cathode) and a second electrode 30B are connected with a metal wire 26. A backside of a die of a next optical semiconductor device 25 is attached to the second electrode 30B. An electrode on the surface of the die and a third electrode 30C is connected with a metal wire 26. The series connection is realized by repeating this form of connection. A desired size of the lighting panel is formed by connecting a plurality of the metal substrates 23 by soldering. An isolation resin 27 is potted to cover the optical semiconductor element 25 and the metal wire 26.

The optical semiconductor elements 25 are mounted on the first metal substrate 23, and then a plurality of the metal substrates 23 is mounted on a second metal substrate 24 to form the reference lighting device of a desired size. A need for the process step to mount the optical semiconductor element 25 on the first metal substrate 23 is due to a wire-bonding apparatus used in connecting the anode (or cathode) electrode and each electrode with the metal wire 26.

That is to say, a size of a substrate, which can be placed on a workbench of a commonly used wire-bonding apparatus, is 150 mm×150 mm at most. Therefore, in order to form a lighting device for plant growing larger than that (500 mm×500 mm for example), it is necessary that each of the substrates 23 is attached to a substrate 24 of a desired with adhesive after the optical semiconductor elements 25 are mounted on the small substrate 23 and wire-bonding is made on the optical semiconductor elements 25, and then the substrate 23 is soldered with each other.

However in this embodiment, the backside of the die, which makes a cathode (or anode) of the optical semiconductor element 65 composing the light-emitting device 68 (consisting of the optical semiconductor element 65 (LED) sealed with resin) and the backside of the die wire-bonded to the anode (or cathode) through the metal wire 66 are attached to each electrode 30, as well as the backside of the die that makes the cathode (or anode) of the next optical semiconductor element 65 (LED) and the backside of the die wire-bonded to the anode (or cathode) through the metal wire 66 are attached to each electrode 30, as described before. Since no wire-bonding on the metal substrate 71 is required, there is no restriction caused by the wire-bonding apparatus as in the manufacturing method of the reference lighting device. While the size of the substrate is limited to 150 mm×150 mm maximum with the wire-bonding apparatus, a chip mounting apparatus (a robot with an arm movable in X, Y and Z directions) can handle the substrate of up to 500 mm×500 mm.

The workability is improved by mounting the completed light-emitting devices 68 directly onto the large metal substrate 71 with the chip mounting apparatus.

Also, the heat dissipation is improved, the supporting substrate is dispensed with, the cost is reduced and the device is smaller, thinner and lighter, since the light-emitting device 68 is directly mounted onto the metal substrate 71.

When a plurality of the LEDs is mounted on the first metal substrate 23 and the substrate 23 is mounted on the second metal substrate 24 using an adhesive, there is a problem that an entire light-emitting unit becomes not usable, if even only one LED 25 on the substrate 23 is defective (not emitting light).

Mounting only good light-emitting devices is possible with this embodiment, because each of the completed light-emitting devices 68 is mounted directly onto the metal substrate 71 using the chip mounting apparatus. And thus the workability is improved.

Figure 8B:
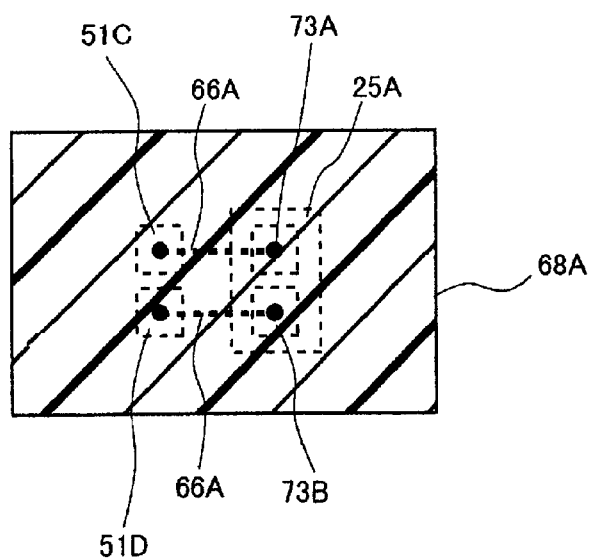
FIG. 8B shows a top view of an optical semiconductor element of the first embodiment having an anode and a cathode on its topside.

The optical semiconductor element 25 with the cathode or anode formed on its backside and with the anode or cathode on its topside is used in this embodiment. As shown in FIG. 8B, an optical semiconductor element having anode 73A and cathode 73B on its topside and each of the electrodes 73A and 73B electrically connected to each of a first electrode 51C and a second electrode 51D, respectively, though a metal wire 66A can be used as well. A blue LED is one of the examples of the optical semiconductor element 25A of this structure.

Figure 9:
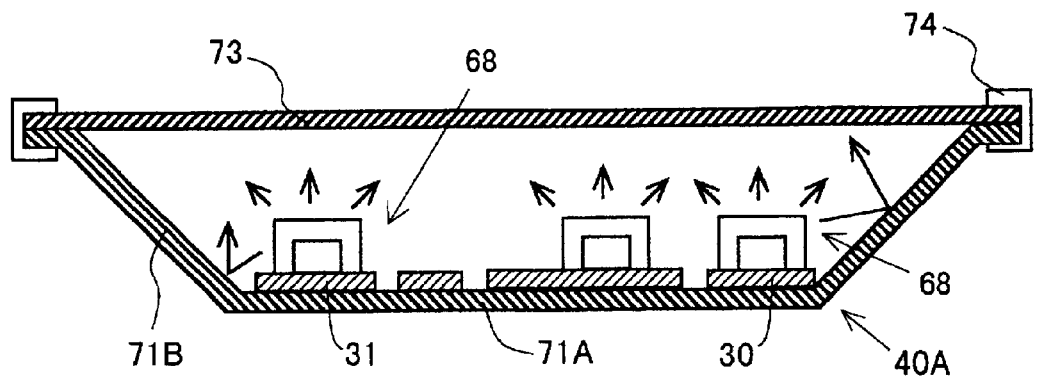
FIG. 9 shows a cross-sectional view of the lighting device according to a second embodiment of the invention.

A second embodiment of this invention will be explained below referring to FIG. 9.

In this embodiment, a metal substrate 71A on which the light-emitting device 68 is mounted has a bent portion 71B in its periphery, which is bent upward to reflect the light from the light-emitting device 68 (optical semiconductor element 25). More light from the optical semiconductor element 25 is emitted upward by the bent portion 71B, which is shaped by a drawing process using a pressing apparatus and the like.

A flat portion is formed at the end of the bent portion 71B. A lighting device 40A is completed as a light emitting panel of a desired size, with a transparent panel 73 such as a glass substrate put on the flat portion and fixed to the metal substrate 71A with a fixture 74 such as a rubber packing. The lighting device 40A is filled with dry air. The transparent panel 73 can be fixed to the metal substrate 71A with a screw. A gap between the substrate 71A and the transparent panel 73 is filled with packing such as rubber or sponge. Fixing can be done with an adhesive also.

In this configuration, light-emitting efficiency is improved compared with the first embodiment that uses a flat metal substrate 71. Although it is possible to improve the light-emitting efficiency with reflecting material formed close to the light-emitting device 68 or at least in the periphery of the metal substrate 71, such a configuration raises the cost.

With the bent portion 71B formed in the metal substrate 71A, putting the transparent panel 73 on the flat portion of the bent portion 71B and fixing the transparent panel 73 to the metal substrate 71A with the fixture 74 are enough to cover the light-emitting device 68, minimizing the number of components to constitute the lighting device.

As clearly stated in the above explanation, this invention makes the constitution of a lighting device possible with minimum components of the optical semiconductor element, conductive passage and the transparent resin without a loss of resources. Therefore no redundant component is required throughout the process, and the light-emitting device can be realized at significantly reduced cost. Also the light-emitting device can be made very small, thin and light by optimizing the thickness of the transparent resin and the thickness of the conductive foil.

Further advantage is that the invention dispenses with the backside electrode and the through hole required in the conventional method, since the backside of the conductive passage is exposed and available for external connection. The heat dissipation and the driving capability of the optical semiconductor element are improved compared with the conventional structure, in which the optical semiconductor element is mounted on the printed circuit board.

The lighting device formed by mounting a plurality of such light-emitting devices directly on the metal substrate can improve heat dissipation, dispense with the supporting substrate to mount light-emitting device and make the lighting device smaller, thinner and lighter.

Since the metal substrate has a bent portion in its periphery, which is bent upward to reflect the light from the light-emitting device, more light from the optical semiconductor element is emitted upward by the bent portion.

By utilizing the bent portion, the optical semiconductor element can be covered with the transparent panel, minimizing the number of the components to form the lighting device.

The falling off of the conductive electrode from the mold resin can be prevented by setting the melting point of the solder used in mounting the light-emitting device on the metal substrate lower than the molding temperature of the resin.

The workability is improved by mounting each of the light-emitting devices directly on the metal substrate using the robot movable horizontally and vertically. Also the workability is improved since only good light-emitting devices are mounted on the metal substrate.

The conductive foil connecting individual device portions is thinned only after the light-emitting devices are covered with the transparent resin for supporting the light-emitting devices. Then, the individual light-emitting devices are separated from each other. This improves the workability since the conductive foil can be processed as a single sheet until the final processing step where each of the light-emitting devices is separated from each other.

What is claimed is:

1. A manufacturing method of lighting device comprising:
   providing a conductive foil;
   forming a plurality of separation grooves in the conductive foil to define portions of the conductive foil to be used as conductive passages, a depth of the separation groove being shorter than a thickness of the conductive foil;
   fixing an optical semiconductor element on one of the defined portions of the conductive foil;
   covering the optical semiconductor element and the conductive foil with a transparent resin so that the separation grooves are filled with the transparent resin;
   removing a backside portion of the conductive foil to expose the transparent resin, the backside portion of the conductive foil not being covered by the transparent resin;
   separating a portion of the conductive foil having the optical semiconductor element and covered by the transparent resin to provide a light-emitting device; and
   mounting the light-emitting device on a metal substrate.

2. The manufacturing method of lighting device of claim 1, further comprising bending a peripheral portion of the metal substrate so that the peripheral portion slants with respect to a central portion of the metal substrate, light from the optical semiconductor element being reflected by the peripheral portion toward a direction approximately normal to the central portion of the metal substrate.

3. The manufacturing method of lighting device of claim 2, further comprising covering the light-emitting device with a transparent panel and supporting the transparent panel by the peripheral portion of the metal substrate.

4. The manufacturing method of lighting device of claim 1, wherein the mounting of the light-emitting device on the a metal substrate comprises fixing an electrode of the light-emitting device to an electrode on the metal substrate with a solder, a melting point of the solder being lower than a molding temperature of the transparent resin.

5. The manufacturing method of lighting device of claim 1, further comprising forming a conductive film on a predetermined area of the defined portion of the conductive foil to receive the optical semiconductor element before the optical semiconductor element is fixed on the defined portion of the conductive foil.

6. The manufacturing method of lighting device of claim 1, further comprising connecting an electrode of the optical semiconductor element and another of the defined portions of the conductive foil with a bonding wire before the optical semiconductor element and the conductive foil are covered with the transparent resin.

7. The manufacturing method of a lighting device of claim 1, further comprising connecting a first electrode disposed on a first surface of the optical semiconductor element to the defined portion of the conductive foil receiving the optical semiconductor element, the first surface facing the conductive foil, and connecting a second electrode disposed on a second surface of the optical semiconductor element to another of the defined portions of the conductive foil.

8. The manufacturing method of a lighting device of claim 1, further comprising connecting a first electrode and a second electrode each disposed on a surface of the optical semiconductor element to corresponding defined portions of the conductive foil, the corresponding defined portions not being the defined portion of the conductive foil receiving the optical semiconductor element.

9. The manufacturing method of lighting device of claim 1, wherein the conductive foil is made of copper, aluminum, nickel, iron or a composite film thereof.

10. The manufacturing method of lighting device of claim 5, wherein the conductive film comprises a plated film made of nickel, gold, palladium, aluminum or silver.

11. The manufacturing method of lighting device of claim 1, wherein the forming of the separation grooves comprises selectively etching the conductive foil either chemically or physically.

12. The manufacturing method of lighting device of claim 1, wherein the mounting of the light-emitting device on the metal substrate comprising using a robot with an arm movable horizontally and vertically.

* * * * *